(12) United States Patent
Goujard et al.

(10) Patent No.: US 11,198,934 B2
(45) Date of Patent: Dec. 14, 2021

(54) METHOD OF CHEMICAL VAPOR INFILTRATION OR DEPOSITION

(71) Applicant: SAFRAN CERAMICS, Le Haillan (FR)

(72) Inventors: Stéphane Goujard, Moissy-Cramayel (FR); Adrien Delcamp, Moissy-Cramayel (FR); Cédric Descamps, Moissy-Cramayel (FR)

(73) Assignee: SAFRAN CERAMICS, Le Haillan (FR)

( * ) Notice: Subject to any disclaimer, the term of this patent is extended or adjusted under 35 U.S.C. 154(b) by 483 days.

(21) Appl. No.: 16/313,824

(22) PCT Filed: Jun. 27, 2017

(86) PCT No.: PCT/FR2017/051712
§ 371 (c)(1),
(2) Date: Dec. 27, 2018

(87) PCT Pub. No.: WO2018/002510
PCT Pub. Date: Jan. 4, 2018

(65) Prior Publication Data
US 2019/0389774 A1    Dec. 26, 2019

(30) Foreign Application Priority Data
Jun. 29, 2016   (FR) ...................................... 1656092

(51) Int. Cl.
*C04B 35/571*    (2006.01)
*C23C 16/04*     (2006.01)
(Continued)

(52) U.S. Cl.
CPC .......... *C23C 16/045* (2013.01); *C04B 35/571* (2013.01); *C04B 35/62863* (2013.01);
(Continued)

(58) Field of Classification Search
CPC ... C23C 16/045; C23C 16/325; C04B 35/571; C04B 35/62863; C04B 35/62873;
(Continued)

(56) References Cited

U.S. PATENT DOCUMENTS 5,733,655 A      3/1998  Bors et al.
2007/0007386 A1*  1/2007  Coupe .................... F16C 7/026
                                                   244/102 A

FOREIGN PATENT DOCUMENTS

CA    2937144 A1    8/2015
EP    2933353 A1    10/2015
(Continued)

OTHER PUBLICATIONS

International Search Report and Written Opinion dated Oct. 24, 2017 in International Application PCT/FR2017/051712.
(Continued)

*Primary Examiner* — Jeffrey M Wollschlager
*Assistant Examiner* — Xue H Liu
(74) *Attorney, Agent, or Firm* — Pillsbury Winthrop Shaw Pittman LLP

(57) ABSTRACT

A method of chemical vapor infiltration or deposition includes forming silicon carbide in pores of a porous substrate or on a surface of a substrate, the substrate being placed in a reaction enclosure, the silicon carbide being formed from a gas phase introduced into the reaction enclosure, the gas phase including a reagent compound that is a precursor of silicon carbide and that has the following formula (Continued)

in which n is an integer equal to 0 or 1; m is an integer lying in the range 1 to 3; p is an integer lying in the range 0 to 2 with m+p=3; and R designates —H or —CH$_3$; a ratio C/Si between the number of carbon atoms and the number of silicon atoms in the introduced gas phase lying in the range 2 to 3.

10 Claims, 4 Drawing Sheets

(51) Int. Cl.
  C04B 35/628 (2006.01)
  C23C 16/32 (2006.01)
  C04B 35/80 (2006.01)
(52) U.S. Cl.
  CPC ........ C04B 35/62873 (2013.01); C04B 35/80 (2013.01); C23C 16/325 (2013.01); *C04B 2235/5244* (2013.01); *C04B 2235/5248* (2013.01); *C04B 2235/5252* (2013.01); *C04B 2235/614* (2013.01)

(58) Field of Classification Search
  CPC ............ C04B 35/80; C04B 2235/5244; C04B 2235/5248; C04B 2235/5252; C04B 2235/614
  USPC .......................................................... 264/82
  See application file for complete search history.

(56) References Cited

FOREIGN PATENT DOCUMENTS

| | | |
|---|---|---|
| JP | H11-335170 A | 12/1999 |
| RU | 2130509 C1 | 5/1999 |
| RU | 2394117 C2 | 7/2010 |

OTHER PUBLICATIONS

Hengge E. et al., "The formation of Silicon Carbide Films from Disilane Derivatives,"; Advanced Materials, Wiley-V C H Verlag GmbH & Co. KGAA, DE, vol. 6, No. 7/08, Jul. 1, 1994.

Notice of Reasons for Rejection as issued in Japanese Patent Application No. 2018-568783, dated Aug. 3, 2021.

\* cited by examiner

METHOD OF CHEMICAL VAPOR INFILTRATION OR DEPOSITION

CROSS REFERENCE TO RELATED APPLICATIONS

This application is the U.S. National Stage of PCT/FR2017/051712 filed Jun. 27, 2017, which in turn claims priority to French Application No. 1656092, filed Jun. 29, 2016. The contents of both applications are incorporated herein by reference in their entirety.

BACKGROUND OF THE INVENTION

The invention relates to a method of chemical vapor infiltration or deposition in which silicon carbide (SiC) is formed in the pores of a porous substrate or on a surface of a substrate.

Making use of composite materials having a silicon carbide ceramic matrix is known in the fields of aviation and space. Such composite materials present good mechanical properties making them suitable for constituting structural elements, and advantageously they conserve those properties at high temperatures.

Such materials can be fabricated by densifying a fiber preform with a silicon carbide matrix by using a gaseous technique (known as chemical vapor infiltration (CVI)). In such a technique, the preform for densifying is placed in a densification oven into which a gas phase including a silicon carbide precursor is introduced. A precursor that is typically used for forming a stoechiometric silicon carbide matrix is methyltricholorosilane ($CH_3SiCl_3$ or MTS). Selecting MTS is justified by the fact that in the MTS molecule itself, both carbon and silicon are present in identical proportions, as they are in the looked-for stoechiometric silicon carbide. Such a CVI densification method is particularly reliable, but it can present a limitation in terms of the resulting deposition yield, which can lead to lengthening the treatment cycle and thus to relatively high costs of performance. Specifically, a portion of the MTS precursor can be consumed for making a silicon-rich deposit of no value at the inlet to the oven. The silicon as consumed in this way is no longer available for forming the silicon carbide matrix inside the preforms present in the working zone of the oven, thereby limiting deposition yield.

Furthermore, when the preforms for densifying are thick, the CVI method as described above can fail to lead to good filling of the pores in those preforms.

There therefore exists a need to have methods available that enable stoechiometric silicon carbide to be formed by a gaseous technique with improved yield.

There also exists a need to have CVI methods available that enable stoechiometric silicon carbide to be formed inside porous silicons with an improved fill fraction of the pores.

OBJECT AND SUMMARY OF THE INVENTION

To this end, in a first aspect, the invention provides a method of chemical vapor infiltration or deposition comprising at least the following steps:

forming silicon carbide in the pores of a porous substrate or on a surface of a substrate, the substrate being placed in a reaction enclosure, the silicon carbide being formed from a gas phase introduced into the reaction enclosure, the gas phase comprising a reagent compound that is a precursor of silicon carbide and that has the following formula:

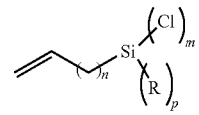

in which:
n is an integer equal to 0 or 1;
m is an integer lying in the range 1 to 3;
p is an integer lying in the range 0 to 2 with m+p=3; and
R designates —H or —$CH_3$;
the ratio C/Si between the number of carbon atoms and the number of silicon atoms in the introduced gas phase lying in the range 2 to 3.

Using a precursor having the formula given above (referred to below as "precursor A") serves advantageously to form silicon carbide at a growth rate that is faster than when using MTS. The use of such a precursor also makes it possible to obtain better filling of the pores while infiltrating a porous substrate. The inventors have also observed that stoechiometric silicon carbide can be obtained using precursor A even though precursor A presents a plurality of carbon atoms for each silicon atom. Obtaining such a stoechiometric deposit is the result of the carbon content being limited in the introduced gas phase by imposing a value in the range 2 to 3 for the ratio C/Si (i.e. [atom content of carbon in the introduced gas phase]/[atom content of silicon in the introduced gas phase]).

In an implementation, R may designate —H.

Such a characteristic is advantageous since it contributes to further reducing the carbon content in the gas phase used.

In an implementation, n may be equal to 0.

Such a characteristic is advantageous since it contributes to further reducing the carbon content in the gas phase used.

In an implementation, the reagent compound may be selected from: vinylchlorosilane ($CH_2CHSiH_2Cl$); vinyldichlorosilane ($CH_2CHSiHCl_2$); vinyltrichlorosilane ($CH_2CHSiCl_3$); vinylmethylmonochlorosilane ($CH_2CHSiCH_3ClH$); and allytrichlorosilane ($CH_2CHCH_2SiCl_3$).

In an implementation, the reagent compound may be vinyltrichlorosilane or allytrichlorosilane.

In an implementation, the gas phase may include only one reagent compound that is a precursor of silicon carbide. In an implementation, the gas phase may be free from any additional carbon-containing reagent compound, other than the precursor A.

In an implementation, the ratio C/Si may be equal to 2 or it may be equal to 3. The ratio C/Si may also be strictly greater than 2 and less than or equal to 3. By way of example, such a variant is possible when the gas phase comprises both precursor A having two carbon atoms and an additional carbon containing reagent compound such as acetylene. Under such circumstances, the quantity of the additional carbon-containing reagent compound in the gas phase should naturally be limited so as to keep the ratio C/Si to a value less than or equal to 3.

The present invention also provides a method of fabricating a composite material part having a matrix that is made at least in part out of silicon carbide, the method comprising at least the following steps:

densifying a fiber preform of the part that is to be obtained with a silicon carbide matrix phase by performing a method as described above.

The fiber preform may be made from yarns of ceramic material or of carbon material.

In an implementation, the fiber preform may be formed as a single piece by three-dimensional weaving or else from a plurality of two-dimensional fiber plies.

The part as fabricated in this way may be a part for an aviation application or a space application.

The part as fabricated in this way may be a part for the hot portion of a gas turbine in an aviation or space engine or in an industrial turbine. The part may be a part of a turbine engine. The part may constitute at least a portion of a guide vane nozzle, at least a portion of a tail pipe nozzle, or a thermal protection coating, a wall of a combustion chamber, a turbine ring sector, or a turbine engine blade.

BRIEF DESCRIPTION OF THE DRAWINGS

Other characteristics and advantages of the invention appear from the following description given by way of non-limiting example and with reference to the accompanying drawings, in which.

DETAILED DESCRIPTION OF IMPLEMENTATIONS

Figure 1:
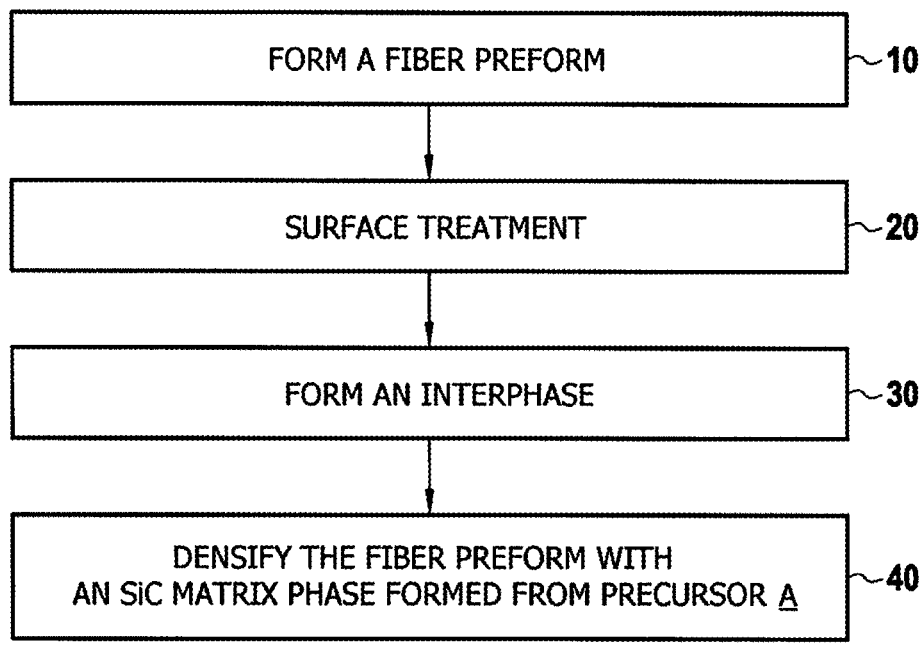
FIG. 1 is a flow chart of the various steps for forming silicon carbide in the pores of a porous substrate by performing an implementation of the method of the invention.

An implementation of a method of fabricating a porous substrate and performing chemical vapor infiltration on such a substrate is described with reference to FIG. 1.

The porous substrate is initially formed in a first step 10. In the implementation shown, the porous substrate is a fiber preform having the shape of a composite material part that is to be obtained. The fiber preform is for constituting the fiber reinforcement of the part that is to be obtained. The fiber preform presents accessible pores that are to be filled in full or in part with a matrix that is made at least in part out of silicon carbide.

The fiber preform may comprise various ceramic or carbon yarns, or indeed of a mixture of such yarns. By way of example, it is possible to use silicon carbide yarns supplied by the Japanese supplier NGS under the reference "Nicalon", "Hi-Nicalon", or indeed "Hi-Nicalon Type S". By way of example, suitable carbon fibers are supplied under the name Torayca T300 3K by the supplier Toray.

In step 10, the fiber preform is obtained by performing at least one textile operation on the ceramic and/or carbon fibers. In particular, the fiber preform may be obtained by multilayer or three-dimensional weaving of such yarns.

The term "three-dimensional weaving" or "3D weaving" should be understood as a weaving technique in which at least some of the warp yarns link weft yarns together over a plurality of weft layers. In the present specification, it is also possible for the roles to be interchanged between warp and weft, and that also should be considered as being covered by the claims.

By way of example, the fiber preform may present a multi-satin weave, i.e. it may be a fabric obtained by three-dimensional weaving with a plurality of weft yarn layers in which the basic weave of each layer is equivalent to a conventional satin type weave, but in which certain points of the weave link weft yarn layers together. In a variant, the fiber preform may present an interlock weave. The term "interlock weave or fabric" should be understood as a 3D weave in which each layer of warp yarns links together a plurality of layers of weft yarns with all of the yarns in the same warp column having the same movement in the weave plane. Various multilayer weaving techniques that are suitable for forming the fiber preform are described in Document WO 2006/136755.

It is also possible to obtain fiber textures such as two-dimensional fabrics or unidirectional sheets, and to obtain the fiber preform by draping such fiber textures on a shaper. The textures may optionally be bonded together, e.g. by stitching or by implanting yarns in order to form the fiber preform.

It is preferable to perform a step 20 of applying surface treatment to the yarns, before forming the interphase, in particular in order to eliminate the sizing present on the yarns.

Step 30 consists in forming an embrittlement-relief interphase by CVI on the yarns forming the fiber reinforcement. The interphase is to lie between the yarns and the matrix in the final part. The interphase may comprise a single layer or multiple layers. The interphase may include at least one layer of pyrolytic carbon (PyC), of boron nitride (BN), of silicon-doped boron nitride (BN(Si), with silicon at a weight percentage lying in the range 5% to 40%, and the balance being boron nitride), or boron-doped carbon (BC, with boron present at an atomic percentage in the range 5% to 20%, the balance being carbon). By way of example, the thickness of the interphase may lie in the range 10 nanometers (nm) to 1000 nm, and for example it may lie in the range 10 nm to 100 nm. After the interphase has been formed, the fiber preform remains porous, since only a minority fraction of the initially accessible pores is filled in by the interphase. In this example, the function of the interphase is to provide embrittlement-relief for the composite material, by encouraging any cracks that reach the interphase after propagating through the matrix to be deflected, thereby preventing or delaying such cracks breaking the yarns.

In the presently-described implementation, the interphase is made after the fiber preform has been formed. In a variant, it is possible to begin by forming the interphase on the yarns and then make the fiber preform by performing one or more textile operations.

Once the interphase been formed, a matrix is formed in the pores of the fiber preform in order to densify it (step 40). The matrix coats the yarns of the fiber preform. The yarns of the preform are present in the matrix. The matrix comprises one or more phases, including at least one phase of silicon carbide that is obtained from the precursor A. In an implementation, the matrix may be formed entirely out of silicon carbide obtained from the precursor A. The chemical formula of the precursor A is set out below.

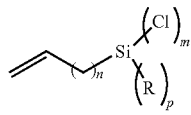

Figure 2:
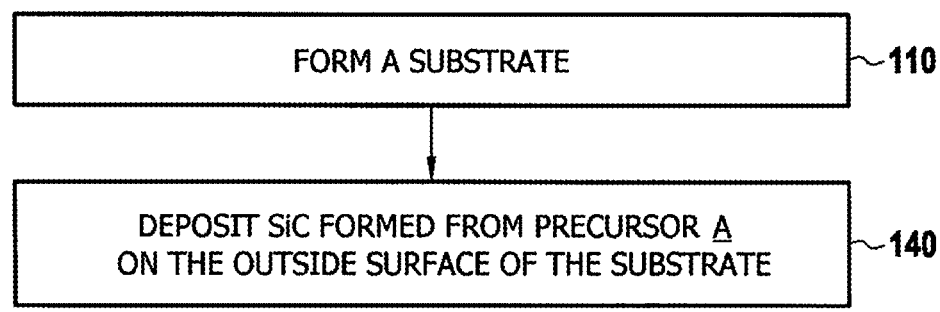
FIG. 2 is a flow chart showing the various steps serving to obtain a silicon carbide coating at the surface of a substrate by performing a variant method of the invention.

It is possible to use a chemical vapor infiltration installation of the same type as that shown in FIG. 2 of Document WO 96/30317 for forming the interphase or for forming the matrix phase(s) by CVI.

The silicon carbide of the matrix is formed from a gas phase that is introduced into the reaction enclosure in which the fiber preform is present. The gas phase comprises the precursor A possibly together with a diluant gas, e.g. comprising an inert gas, such as argon. The gas phase also includes a reducing compound, such as dihydrogen.

The ratio Vp/(Vp+Vr) may lie in the range 3% to 30%, e.g. in the range 5% to 15%, with Vp being the volume of the precursor A in the gas phase that is introduced and Vr being the volume of the reducing compound in the gas phase that is introduced. Furthermore, the rate at which the gas phase is introduced into the reaction enclosure may lie in the range 100 standard cubic centimeters per minute (cm³/min or "sccm") to 300 cm³/min, e.g. in the range 150 cm³/min to 250 cm³/min.

While the silicon carbide is being formed, the temperature in the reaction enclosure may lie in the range 700° C. to 1400° C., e.g. in the range 900° C. to 1100° C., and the pressures inside the reaction enclosure may lie in the range 10 pascals (Pa) to 100 kilopascals (kPa), e.g. in the range 1 kPa to 30 kPa.

Advantageously, the gas phase does not have any carbon-containing reagent compound other than the precursor A. Below, a gas phase in which the precursor A is the only precursor that is present is referred to as a "single-precursor gas phase". In particular, the gas phase need not include any of the following reagent compounds: acetylene, ethylene, propylene, or butene.

As mentioned above, the gas phase presents a C/Si ratio lying in the range 2 to 3 when it is introduced into the reaction enclosure.

Thus, when n=0 in the formula for precursor A, it is possible to have the following:
- p=0 and m=3, so the precursor molecule has two carbon atoms for each silicon atom and thus a C/Si ratio of 2 for a single precursor gas phase;
- p=1 and m=2 with R=—H or —CH₃. For a single-precursor gas phase, there is a C/Si ratio of 2 if R=—H and a C/Si ratio of 3 for R=—CH₃; and
- p=2 and m=1 with R=—H or —CH₃, with the molecule also including a radical R=—CH₃ in order to conserve a C/Si ratio that is less than or equal to 3.

When n=1 in the formula for precursor A, then R=—H (no —CH₃ radical in the molecule) so as to keep the ratio C/Si equal to 3.

The matrix may also advantageously include an additional matrix phase made of ceramic material that is situated between the fibers (or the interphase) and the SiC matrix phase formed from precursor A. This additional phase may be made of SiC or it may be made of a material other than SiC. By way of example, this additional phase may comprise Si₃N₄ or boron carbide or mixed boron and silicon carbide. Naturally, when the additional matrix phase is present, the residual porosity of the fiber preform after this additional phase has been formed remains sufficient to allow the SiC matrix phase to be formed from the precursor A. In a variant, the matrix need not have any such additional phase.

The part may be a stator part or a rotor part for a turbine engine. Examples of turbine engine parts in accordance with the invention are mentioned above.

FIG. 2 shows the various steps of a variant method of the invention. In this variant, one or more layers of silicon carbide are formed on the outside surface of a substrate by chemical vapor deposition (CVD) from a gas phase comprising the precursor A. The same operating conditions in terms of pressure, temperature, and content may be used as are used in the implementation of FIG. 1.

Whatever the implementation under consideration (CVI or CVD) a plurality of substrates may be treated simultaneously by the gas phase in a single reaction enclosure.

EXAMPLES

Example 1 (Invention)

Figure 3:
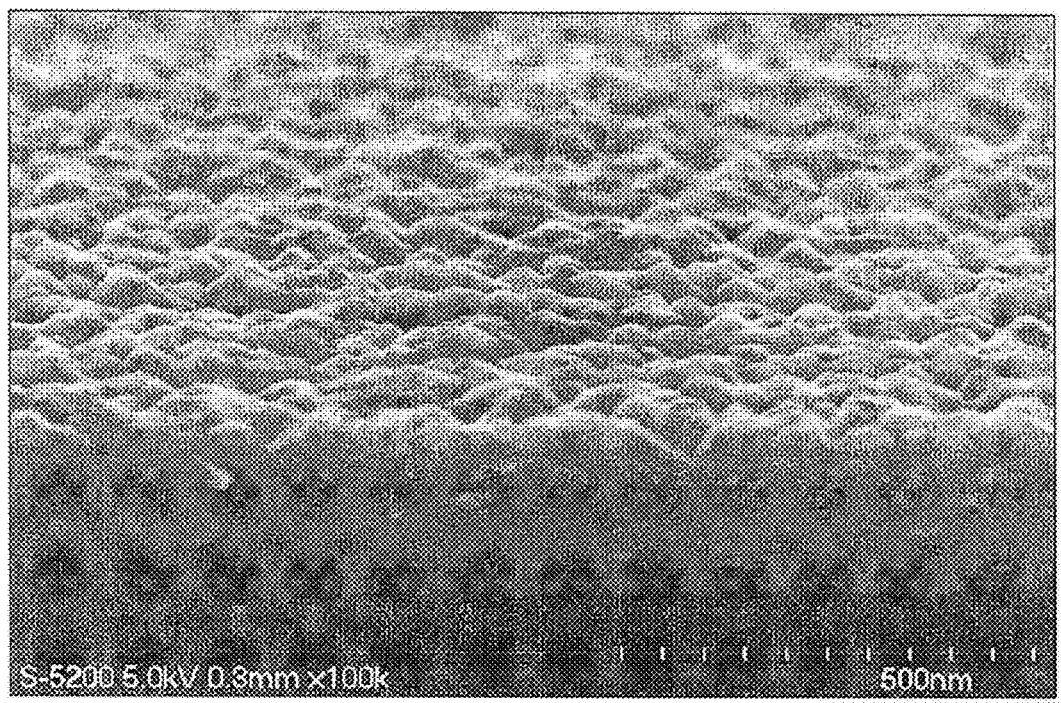
FIG. 3 is a photograph of a silicon carbide deposit obtained by performing an implementation of the method of the invention.
Figure 4:
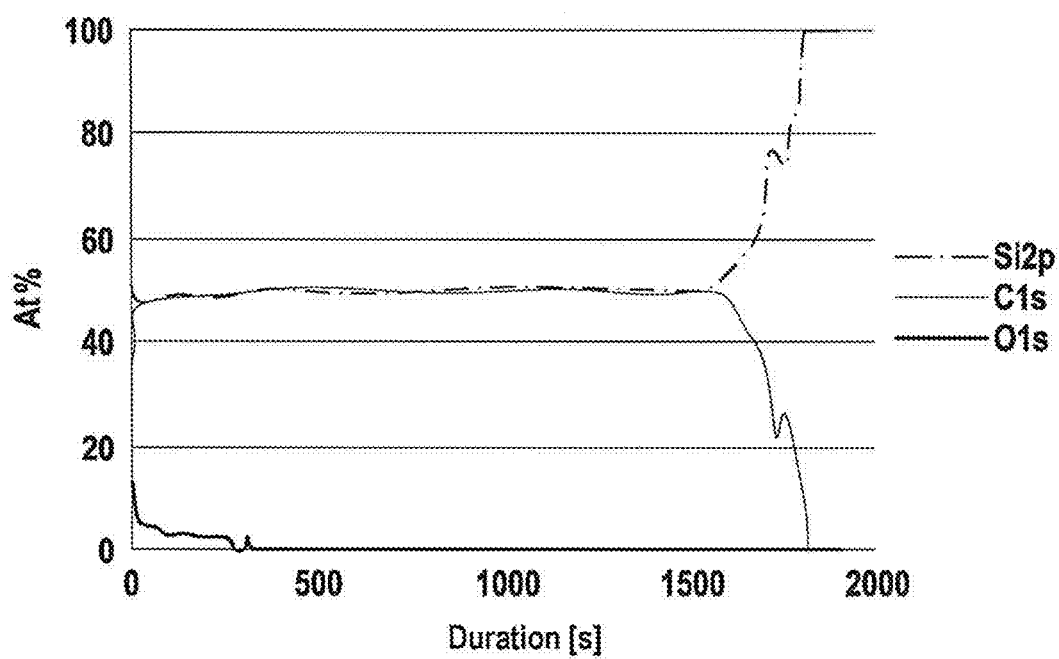
FIG. 4 shows an experimental result providing analysis of the elements of the silicon carbide deposit as obtained in the test associated with FIG. 3.

A silicon substrate or "wafer" was placed in a reactor having a diameter of 45 millimeters (mm) and a working length of 30 centimeters (cm). Vinyltrichlorosilane (VTS) and hydrogen diluted in argon at respective quantities of 1 sccm, 20 sccm, and 980 sccm were injected into the reactor at a temperature of 950° C. and at a pressure of 23 kPa. In this example, the ratio C/Si of the gas phase was equal to 2. A stoechiometric SiC deposit was obtained that grew at a rate of 1.7 micrometers per hour (μm/h). A photograph of the resulting deposit is shown in FIG. 3. FIG. 4 shows the result of a test revealing that an Si/C atom ratio of 1 was obtained in the resulting deposit, and thus showing that stoechiometric silicon carbide was formed.

Example 2 (Comparative)

By way of comparison, a silicon substrate or "wafer" was placed in the same reactor. MTS and hydrogen diluted in argon at respective quantities of 5 sccm, 20 sccm, and 500 sccm were injected into the reactor at a temperature of 950° C. and at a pressure of 10 kPa. Stoechiometric silicon carbide was deposited and grew at a rate of 0.7 μm/h.

It can be seen that the SiC deposit obtained with VTS grew at a deposition rate that was twice as fast as when MTS was used, even though MTS was introduced into the oven at five times the rate of VTS. It can thus be observed that the deposition yield with VTS is significantly greater than the deposition yield with MTS.

Figure 5:
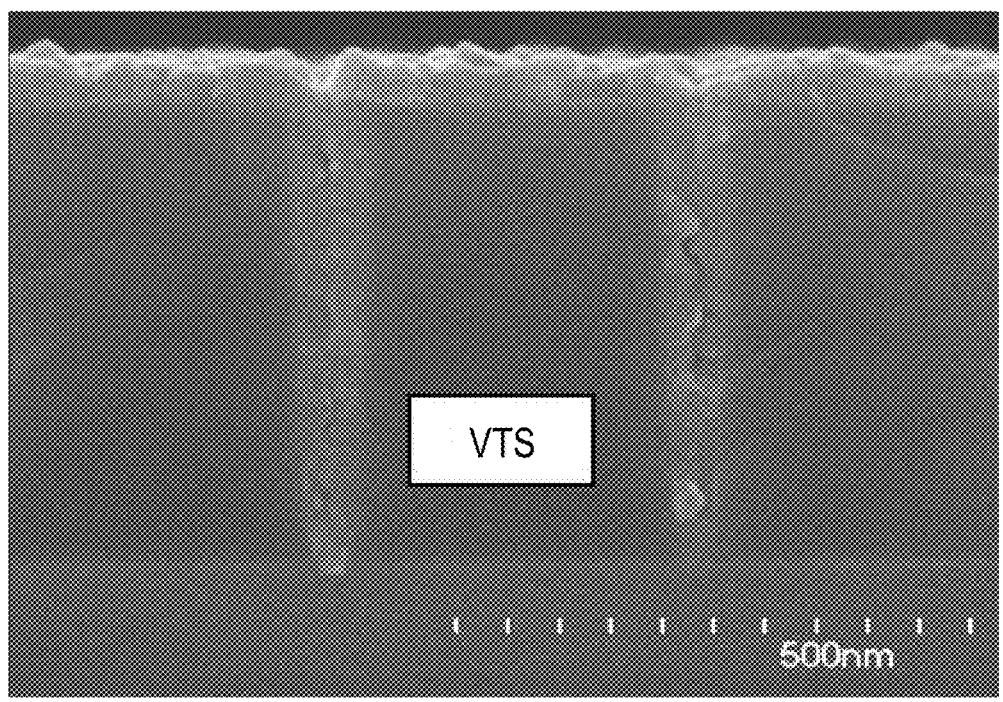
FIG. 5 is a photograph of grooves in a substrate filled with silicon carbide by performing an implementation in the method of the invention.
Figure 6:
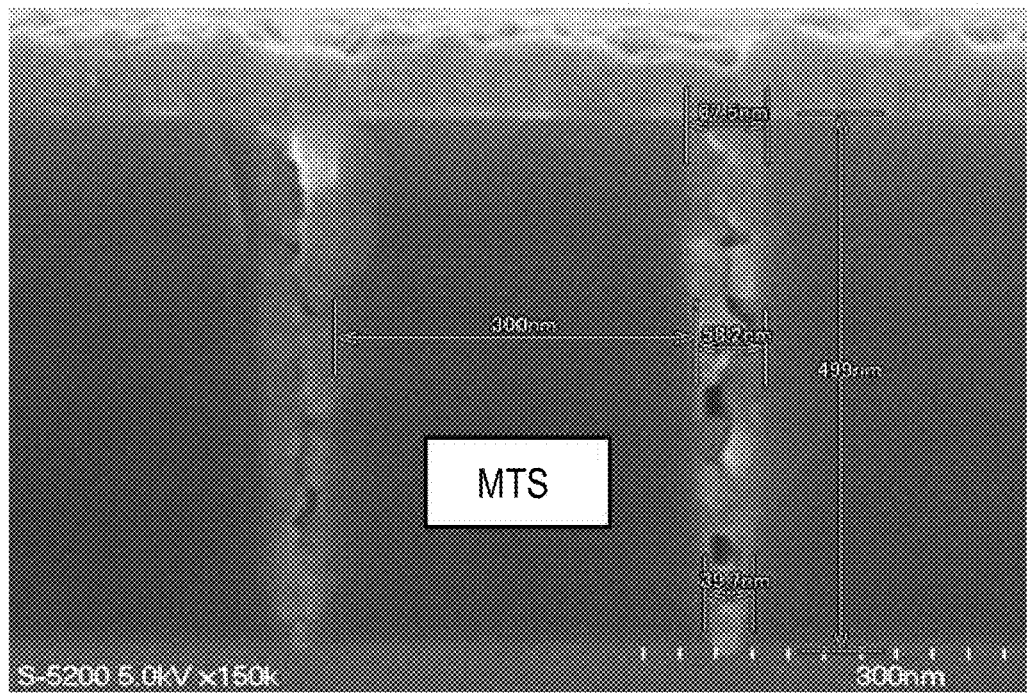
FIG. 6 is a photograph of grooves in a substrate filled with silicon carbide by performing a method that is not part of the invention.

Furthermore, a comparison was made of the ability to infiltrate fine grooves that were eight times deeper than wide. It was found that the deposit obtained from VTS led to the grooves being filled better than the deposit obtained from MTS (see FIG. 5 for VTS and FIG. 6 for MTS). Consequently, the infiltration capacity obtained when using VTS is better than that obtained when using MTS.

Example 3 (Invention)

A silicon substrate or "wafer" was placed in a reactor having a diameter of 45 mm and a working length of 30 cm. Allytrichlorosilane (ATS) and hydrogen diluted in argon at respective quantities of 1 sccm, 20 sccm, and 2000 sccm were injected into the reactor at a temperature of 950° C. and at a pressure of 10 kPa. In this example, the C/Si ratio of the gas phase was equal to 3. A stoechiometric SiC deposit was obtained that grew at a rate of 1.2 µm/h. The deposition yield with ATS is thus significantly better than that obtained with MTS while still using a much smaller quantity of precursor.

Example 4 (Invention)

Figure 7:
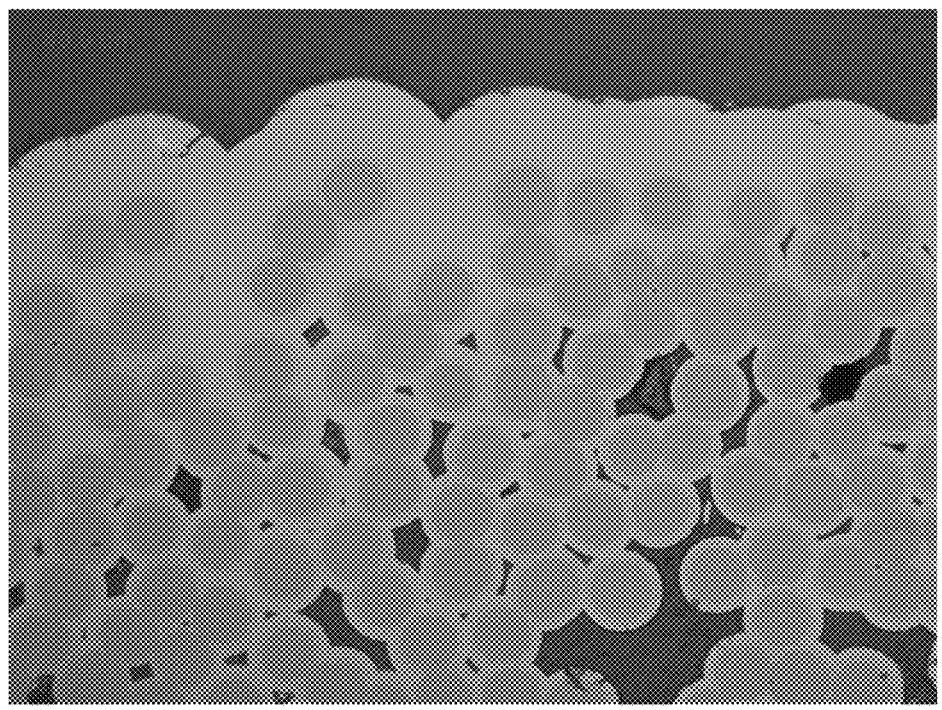
FIGS. 7 and 8 are photographs showing chemical vapor infiltration obtained by performing an implementation of the method of the invention.
Figure 8:
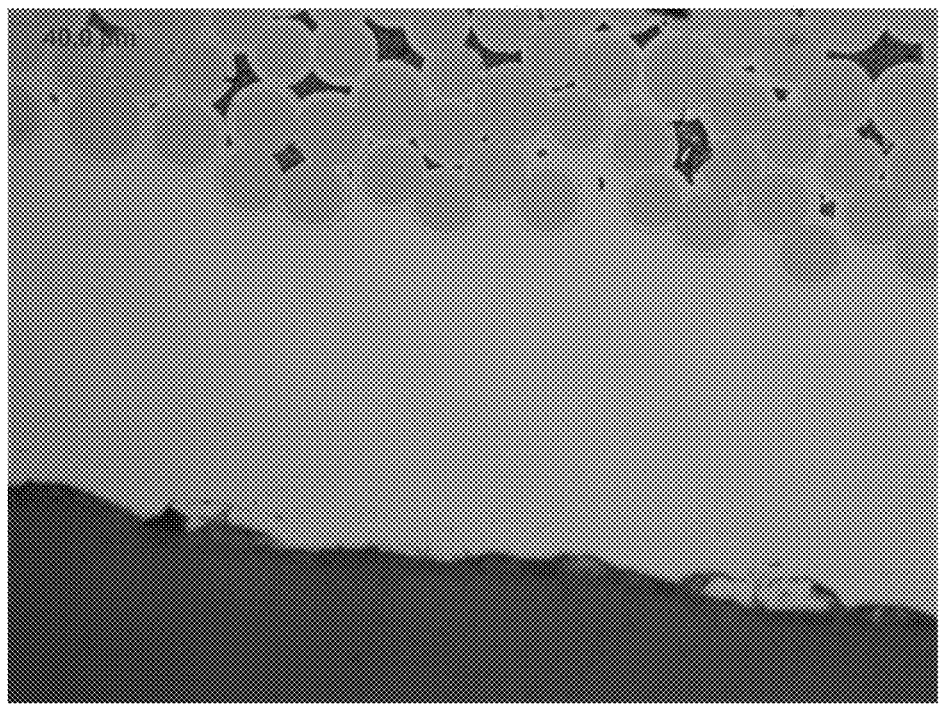

A fiber preform presenting a Guipex® type multilayer texture and made out of Nicalon® fibers was initially prepared. Thereafter, the preform was placed in a graphite shaper so as to obtain a fiber volume fraction of 40%. Thereafter, the shaper was placed in a chemical vapor infiltration oven in order to deposit a pyrolytic carbon interphase having a thickness of 150 nm followed by depositing a silicon carbide matrix using MTS so that the preform was consolidated and capable of retaining its shape after being removed from the shaper. Thereafter, the preform was placed in a reactor having a diameter of 45 mm and a working length of 20 cm. VTS and hydrogen at respective quantities of 13.5 sccm and 280 sccm were injected into the reactor at a temperature of 950° C. and at a pressure of 8 kPa. In this example, the C/Si ratio of the gas phase was equal to 2. By performing wavelength-dispersive X-ray spectrometry (WDS) with a Castaing microprobe, it was found that the SiC deposit that was obtained was stoechiometric. The deposition growth rate of the stoechiometric SiC was about 1 µm/h. A photograph of the resulting deposit is shown in FIG. 7 (in the core of a yarn and around the yarn) and in FIG. 8 (at the surface of the preform). It can be seen that the coating is a covering coating both at the surface and in the core of the material.

The term "lying in the range . . . to . . . " should be understood as including the bounds.

The invention claimed is:

1. A method of chemical vapor infiltration or deposition comprising:
   forming silicon carbide in pores of a porous substrate or on a surface of a substrate, the substrate being placed in a reaction enclosure, the silicon carbide being formed from a gas phase introduced into the reaction enclosure, the gas phase comprising a reagent compound that is a precursor of silicon carbide and that has the following formula:

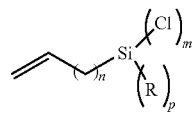

in which:
   n is an integer equal to 0 or 1;
   m is an integer lying in the range 1 to 3;
   p is an integer lying in the range 0 to 2 with m+p=3; and
   R designates —H or —CH$_3$;
a ratio C/Si between the number of carbon atoms and the number of silicon atoms in the introduced gas phase lying in the range 2 to 3 such that the silicon carbide formed is stoichiometric silicon carbide.

2. A method according to claim 1, wherein R designates —H.

3. A method according to claim 1, wherein n is equal to 0.

4. A method according to claim 1, wherein the reagent compound is selected from: vinylchlorosilane; vinyldichlorosilane; vinyltrichlorosilane; vinylmethylmonochlorosilane; and allytrichlorosilane.

5. A method according to claim 4, wherein the reagent compound is vinyltrichlorosilane or allytrichlorosilane.

6. A method according to claim 1, wherein the gas phase does not include any additional carbon-containing reagent compound other than the precursor of silicon carbide.

7. A method according to claim 1, wherein the ratio C/Si is equal to 2 or to 3.

8. A method of fabricating a composite material part having a matrix that is made at least in part out of silicon carbide, the method comprising:
   densifying a fiber preform of the part that is to be obtained with a silicon carbide matrix phase by performing a method according to claim 1.

9. A method according to claim 8, wherein the fiber preform is made from yarns of ceramic material or of carbon material.

10. A method according to claim 8, wherein the fiber preform is formed as a single piece by three-dimensional weaving or from a plurality of two-dimensional fiber plies.

* * * * *